United States Patent
Kraus et al.

(10) Patent No.: US 8,652,861 B1
(45) Date of Patent: Feb. 18, 2014

(54) HPC OPTIMIZATION OF CONTACTS TO OPTOELECTRONIC DEVICES

(71) Applicant: Intermolecular, Inc., San Jose, CA (US)

(72) Inventors: Philip Kraus, San Jose, CA (US); Sandeep Nijhawan, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/722,744

(22) Filed: Dec. 20, 2012

(51) Int. Cl.
*H01L 21/00* (2006.01)

(52) U.S. Cl.
USPC .............................................. 438/29; 438/46

(58) Field of Classification Search
USPC ................... 438/29, 34, 35, 39, 46, 47
See application file for complete search history.

(56) References Cited

U.S. PATENT DOCUMENTS

| | | | | |
|---|---|---|---|---|
| 7,544,574 | B2* | 6/2009 | Chiang et al. | 438/297 |
| 2004/0183116 | A1* | 9/2004 | Cho et al. | 257/303 |
| 2005/0271795 | A1* | 12/2005 | Moini et al. | 427/8 |
| 2007/0082508 | A1* | 4/2007 | Chiang et al. | 438/800 |
| 2007/0202614 | A1* | 8/2007 | Chiang et al. | 438/14 |
| 2009/0227049 | A1* | 9/2009 | Chiang et al. | 438/16 |

* cited by examiner

*Primary Examiner* — Kevin M Picardat

(57) ABSTRACT

HPC techniques are applied to the screening and evaluating the materials, process parameters, process sequences, and post deposition treatment processes for the development of ohmic contact stacks for optoelectronic devices. Simple test structures are employed for initial screening of basic materials properties of candidate materials for each layer within the stack. The use of multiple site-isolated regions on a single substrate allows many material and/or process conditions to be evaluated in a timely and cost effective manner. Interactions between the layers as well as interactions with the substrate can be investigated in a straightforward manner.

19 Claims, 9 Drawing Sheets

HPC OPTIMIZATION OF CONTACTS TO OPTOELECTRONIC DEVICES

TECHNICAL FIELD

The present disclosure relates generally to the use of high productivity combinatorial (HPC) techniques for the development of contact stacks to optoelectronic devices.

BACKGROUND

Optoelectronic devices are often fabricated from Group-III-V elements. Examples include light emitting diodes (LED) fabricated from gallium nitride (GaN). The formation of ohmic contacts to optoelectronic devices is challenging due to the properties of the materials and the surface reactions. Further, ohmic contact schemes must be developed for both n-type and p-type optoelectronic materials.

Generally, the requirements for the ohmic contact materials in an optoelectronic device include good adhesion, low contact resistance, high reflectivity, good thermal stability, and good chemical stability. Other desirable attributes include that the material should be refractory and that the material forms stable nitride compounds.

The requirements and attributes listed above cannot be achieved by a single material. Therefore, the ohmic contacts to optoelectronic devices are typically manufactured as stacks of different layers. The interaction of these layers with and their interaction with the substrate further complicate the development and optimization of the ohmic contact stack.

The development of ohmic contact stacks for optoelectronic devices is largely an empirical task, wherein materials, process parameters, process sequences, and post deposition treatment processes must be evaluated without the benefit of predictive theory. Due to the complexity of the ohmic contact stacks, the number of experiments, time, and cost of the endeavor is daunting. There is a need for efficient methods for screening and evaluating the materials, process parameters, process sequences, and post deposition treatment processes for the development of ohmic contact stacks for optoelectronic devices.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, HPC techniques are applied to the screening and evaluating the materials, process parameters, process sequences, and post deposition treatment processes for the development of ohmic contact stacks for optoelectronic devices. Simple test structures are employed for initial screening of basic materials properties of candidate materials for each layer within the stack. The use of multiple site-isolated regions on a single substrate allows many material and/or process conditions to be evaluated in a timely and cost effective manner. Interactions between the layers as well as interactions with the substrate can be investigated in a straightforward manner.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
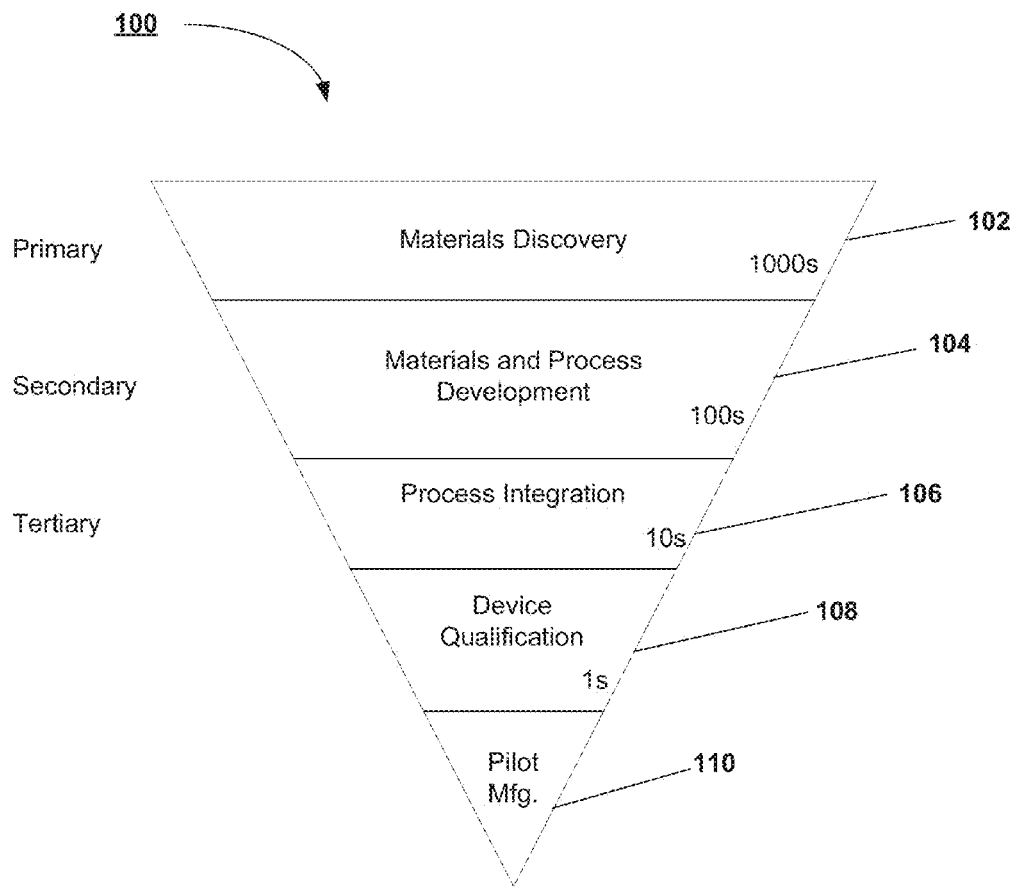
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The terms "about" and "approximately" generally refer to ±10% of a stated value.

Exemplary embodiments are described for convenience by reference to GaN semiconductors, but any Group III element can be substituted for Ga. Further, any Group V element can be substituted for N. Thus, in the most general sense, semiconductors used in the present invention can be any Group III-V semiconductor, i.e., any semiconductor comprising a Group III element and a Group V element.

As used herein, the term "component" refers to a portion of material used in an optoelectronic device. Components can include barrier layers, electrodes, lenses, insulators, and the like. A component may be in the form of a layer, but is not restricted to layers.

As used herein, the term "oxide" refers generally to a compound containing oxygen and at least one other element. The compound may contain a single additional element (e.g., $Al_2O_3$) or it may contain a more complex mixture of two or more additional materials in either stoichiometric or non-stoichiometric ratios. The term "bimetallic oxide" refers to an oxide containing at least two metals and wherein the atomic ratios (metal to metal or metal to oxygen) can be either stoichiometric or non-stoichiometric.

This disclosure will use a LED device as an example. Those skilled in the art will understand that other optoelectronic devices such as optoelectronic sensors and lasers are applicable and fall within the scope of the present disclosure.

The manufacture of LED devices entails the integration and sequencing of many unit processing steps. As an example, LED manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as LED devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, HPC processing techniques have not been successfully adapted to the development of LED devices.

Figure 3:
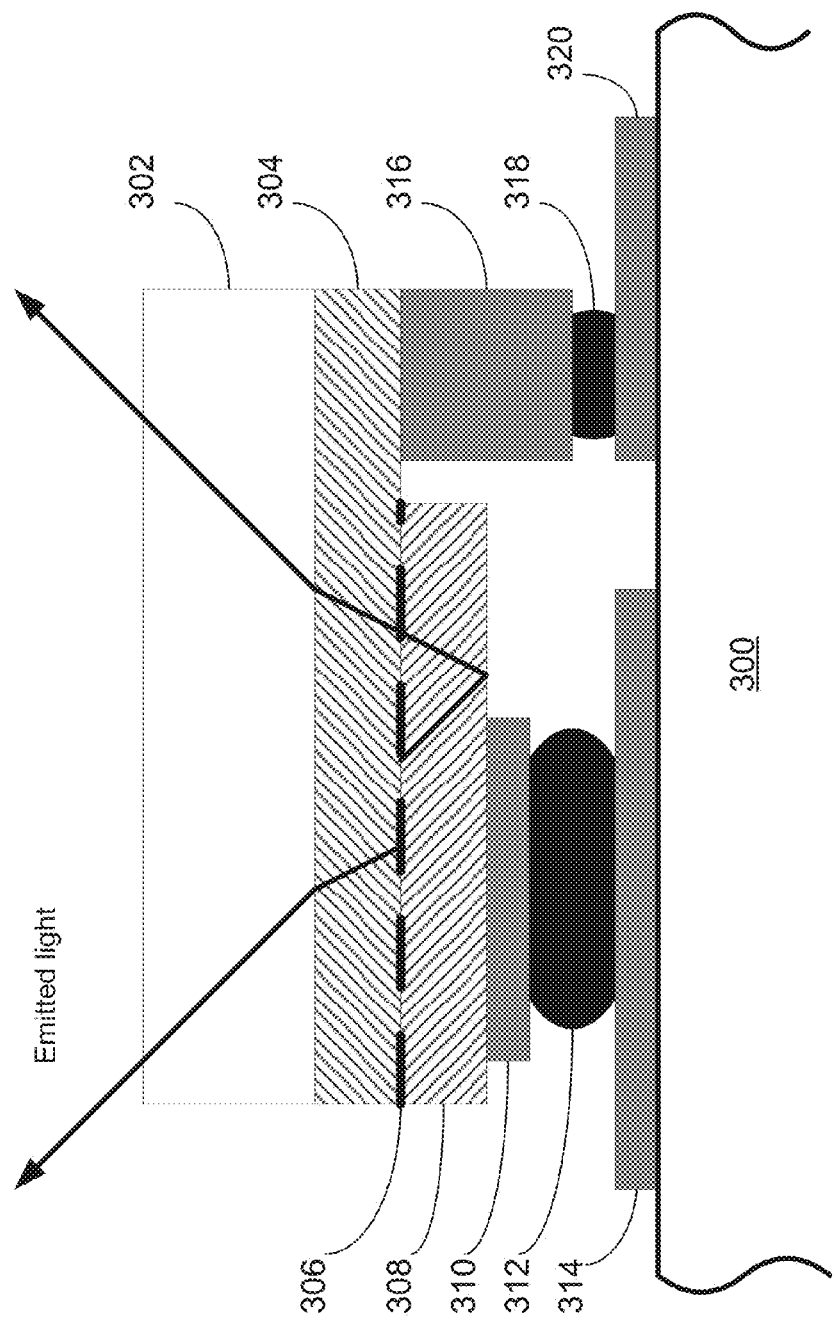
FIG. 3 illustrates a schematic diagram of a simple LED according to some embodiments described herein.
Figure 4:
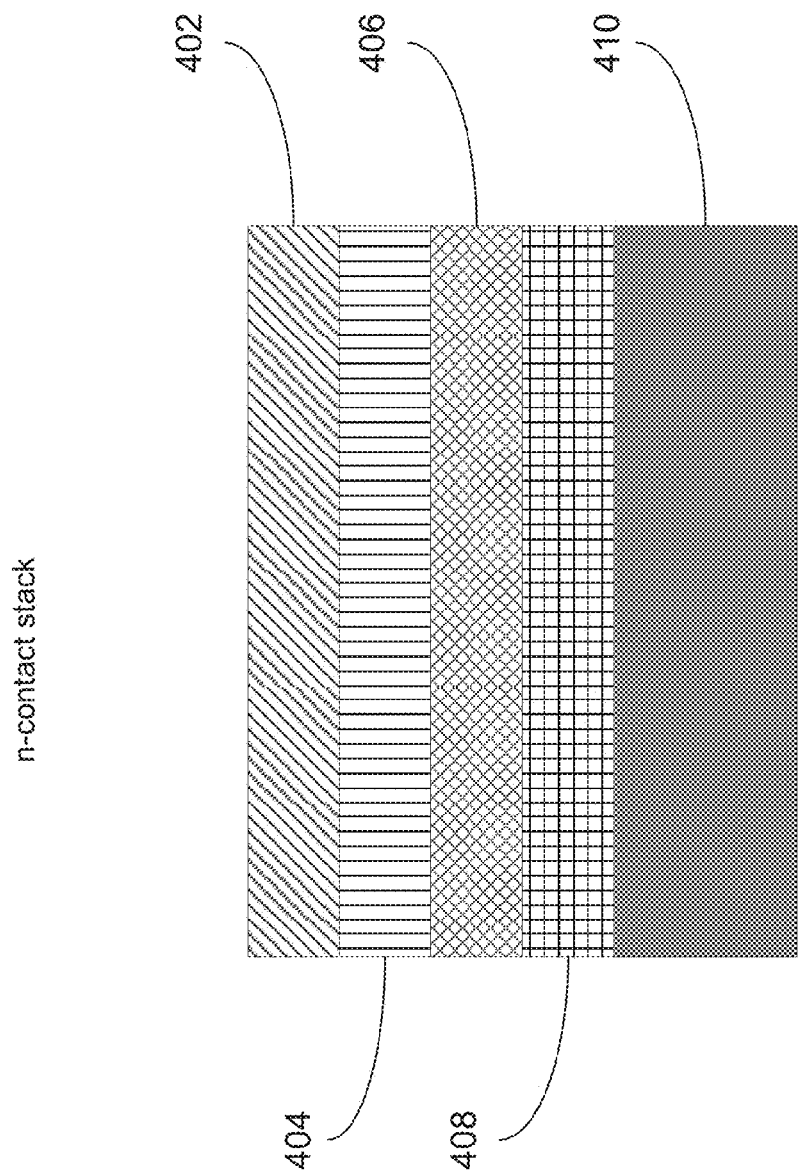
FIG. 4 illustrates a schematic diagram of a simple n-GaN contact stack according to some embodiments described herein.

In FIGS. 3-4 below, a GaN LED ohmic contact stack is illustrated using a simple planar structure. Those skilled in the art will appreciate that the description and teachings to follow can be readily applied to any simple or complex LED device morphology. The drawings are for illustrative purposes only and do not limit the application of the present invention.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of LED manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a LED device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a LED device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the LED device. For example, such structures may include, but would not be limited to, contact layers, buffer layers, absorber layers, or any other series of layers or unit processes that create an intermediate structure found on LED devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
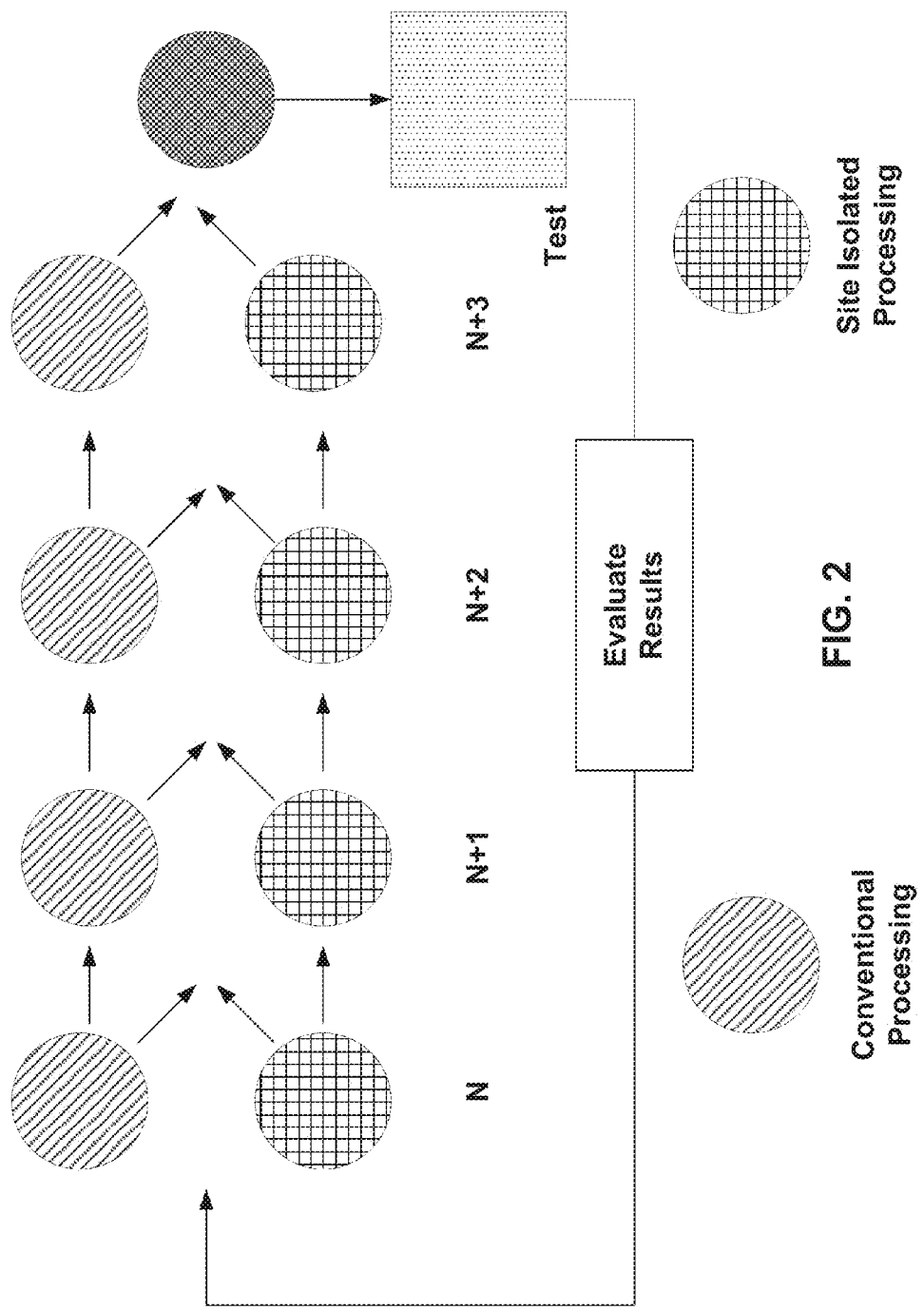
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in LED manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

FIG. 3 illustrates a schematic diagram of a simple LED according to some embodiments described herein. FIG. 3 illustrates a flip-chip configuration of an LED device. In this configuration, the device is mounted to a package or other circuit structure (e.g. printed circuit board and the like), 300. The package will include local interconnect structures, 314 and 320, that apply power and signals to the LED. The LED is attached to the package using solder connections (or other well known mounting technologies), 312 and 318. The LED includes on-chip contacts, 310 and 316. The LED includes a p-type material (e.g. p-GaN) layer, 308, adjacent to an n-type material (e.g. n-GaN) layer, 304. The LED may further include other components such as a quantum well structure, 306, at the interface between the p-type and the n-type materials. The light from the LED is emitted through a transparent material, 302, that is used as the substrate during the formation of the device (hence the term "flip chip" configuration).

The on-chip contacts, 310 and 316, must make ohmic contact to the p-type material and the n-type material, respectively. As discussed previously, the requirements for the ohmic contact materials in an optoelectronic device include good adhesion, low contact resistance, high reflectivity, good thermal stability, and good chemical stability. Other desirable attributes include that the material should be refractory and that the material forms stable nitride compounds.

One approach to forming ohmic contacts between an n-type semiconductor material and a metal is to select a metal having a work function lower than the electron affinity of the semiconductor. As an example, GaN is reported to have an electron affinity between about 3.5 to 4.0 eV. Therefore, candidate metals include those with work functions of less than 4.0 eV. The list of candidate metals includes Ca, K, Rb, Na, Eu, Ba, Yb, Sr, Sm, Ce, Li, Ca, Gd, Tb, Y, Nd, Lu, Th, Sc, Mg, TI, U, As, Hf, and La. Of this list, the candidates with practical application include Y, Yb, Nd, Tb, Eu, Gd, and Sm. The most reflective metals (a requirement discussed previously) are Ag and Al, but their work functions are 4.6 eV and 4.1 eV respectively, which are too high to form a good ohmic contact to n-GaN by themselves. Therefore, the ohmic contact to n-GaN will require a stack of several layers that include high reflectivity layers (e.g. Ag or Al), and layers with low work function elements such as those listed previously.

One approach to forming ohmic contacts between a p-type semiconductor material and a metal is to select a metal having a work function close to and preferably greater than the valence band of the semiconductor. As an example, GaN is reported to have an electron affinity between about 3.5 to 4.0 eV. Therefore, candidate metals include those with work functions of greater than 4.0 eV, and preferably greater than about 5.0 eV. The list of candidate metals includes Zn, Zr, Cd, Al, In, Mg, Nb, Pb, Bi, V, Ga, Ti, Ta, Sn, B, Hg, Cr, Ag, Mo, Sb, Cu, Re, Si, Fe, Ru, W, Be, Rh, Co, Te, C, Ni, Au, Ir, Pd, Pt, Os, and Se. Of this list, the candidates with practical application include Al, Ga, Nb, and Sc. The most reflective metals (a requirement discussed previously) are Ag and Al, and their work functions are 4.6 eV and 4.1 eV respectively, which are appropriate to form a good ohmic contact to p-GaN by themselves. Therefore, the ohmic contact to p-GaN will generally be less complicated than the ohmic contact to n-GaN discussed previously.

FIG. 4 illustrates a schematic diagram of a simple n-GaN ohmic contact stack according to some embodiments described herein. The stack illustrated in FIG. 4 corresponds to element, 316, illustrated in FIG. 3. The diagram in FIG. 4 includes the n-GaN layer, 402, to serve as a reference to the other figures. A transparent conductive oxide (TCO) layer, 404, is in contact with the n-GaN layer. The TCO material is can be doped with a low work function element to form a good ohmic contact. One example of a suitable TCO material includes zinc oxide. Other suitable TCO materials include indium tin oxide and indium zinc oxide. An Ag layer, 406, is included to meet the high reflectivity requirement of the contact stack. As discussed previously, Al can also be used as the high reflectivity layer. A layer, 408, that serves as an adhesion layer, a diffusion barrier layer, and a capping layer is formed over the high reflectivity layer. One example of a suitable material for layer 408 is TiW. Other suitable candidate materials include TiN, TaN, WN, Ti, Ta, and W. Finally, layer 410, forms the contact layer that is suitable for bonding with the solder, 318, or other bonding techniques discussed previously. One example of a suitable material for layer 410 is Al. Other suitable candidate materials include Ag and Au. Using this generic contact stack structure illustrated in FIG. 4, a number of contact systems to n-type and p-type GaN can be envisioned.

In some embodiments, a high reflectivity layer of Ag (or Al) can be in direct contact with the n-GaN layer. However, as discussed previously, the high reflectivity layer would need to be alloyed or doped with an element with a lower work function to form a suitable ohmic contact to the n-GaN. Examples of suitable alloying/doping elements include Y, Yb, Nd, Tb, Eu, Gd, and Sm. The contact resistance between the high reflectivity layer and the n-GaN will be sensitive to the type of alloy/dopant, the concentration of the alloy/dopant, and various processing parameters.

In some embodiments, a doped TCO layer can be in direct contact with the n-GaN layer. The TCO layer can include a material such as ZnO and can be doped with one or more elements such as Al, Ga, Y, Nb, or Sc. Additionally, a high reflectivity layer of Ag (or Al) can be in direct contact with the doped TCO layer. Examples of suitable alloying/dopant elements for the high reflectivity layer include Y, Yb, Nd, Tb, Eu, Gd, and Sm. The contact resistance between the TCO material and the n-GaN will be sensitive to the type of dopant, the concentration of the dopant, and various processing parameters.

In some embodiments, a doped TCO layer can be in direct contact with the n-GaN layer. The TCO layer can include a material such as ZnO and can be doped with one or more elements such as Al, Ga, Y, Nb, or Sc. In some embodiments, a high reflectivity layer of Ag (or Al) is not used in the contact stack. The contact resistance between the TCO material and the n-GaN will be sensitive to the type of dopant, the concentration of the dopant, and various processing parameters.

In some embodiments, a high reflectivity layer of Ag (or Al) can be in direct contact with the p-GaN layer. However, as discussed previously, the high reflectivity layer would need to be alloyed or doped with an element with a work function higher than about 5.0 eV to form a suitable ohmic contact to the p-GaN. Examples of suitable alloying/dopant elements include Pt, Pd, Be, Rh, Co, Te, Ni, Au, Ir, Os, and Se. The contact resistance between the high reflectivity layer and the p-GaN will be sensitive to the type of alloy/dopant, the concentration of the alloy/dopant, and various processing parameters.

In some embodiments, a doped TCO layer can be in direct contact with the n-GaN layer. The TCO layer can include a material such as ZnO and can be doped with one or more elements such as Al, Ga, Y, Nb, or Sc. Additionally, a high reflectivity layer of Ag (or Al) can be in direct contact with the doped TCO layer. Examples of suitable alloying/dopant elements for the high reflectivity layer include Pt, Pd, Be, Rh, Co, Te, Ni, Au, Ir, Os, and Se. The contact resistance between the TCO material and the n-GaN will be sensitive to the type of dopant, the concentration of the dopant, and various processing parameters.

In some embodiments, a doped TCO layer can be in direct contact with the p-GaN layer. The TCO layer can include a material such as ZnO and can be doped with one or more elements such as Al, Ga, Y, Nb, or Sc. In some embodiments, a high reflectivity layer of Ag (or Al) is not used in the contact stack. The contact resistance between the TCO material and the n-GaN will be sensitive to the type of dopant, the concentration of the dopant, and various processing parameters.

GaN has been used as the optoelectronic semiconductor material discussed above and with respect to FIGS. 3 and 4. However, other Group III-V semiconductor material can also be used. Examples include AlN, InN, AlAs, GaAs, InAs, AlP, GaP, InP, AlSb, GaSb, InSb, and the like. Further, contact systems for use with more complex Group III-V semiconductor materials such as AlGaInP can be developed using the same methods and criteria discussed previously. The methodology for selecting candidate materials would be similar. Therefore, the present disclosure is not limited to GaN.

Figure 5:
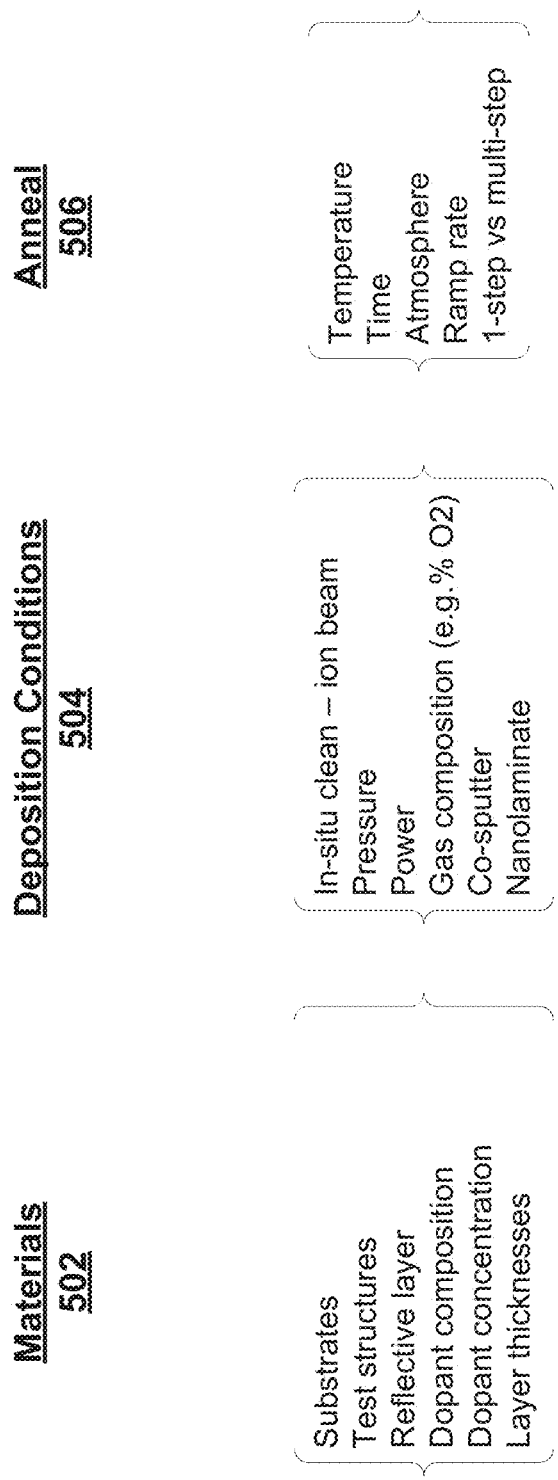
FIG. 5 illustrates a design of experiments strategy according to some embodiments described herein.

FIG. 5 illustrates a design of experiments strategy according to some embodiments described herein. As an example, a survey of the potential variables to be investigated during the development of contact stacks to optoelectronic semiconductor materials might include many categories. A few categories are illustrated in FIG. 5. Those skilled in the art will understand that the three categories illustrated in FIG. 5 are not exhaustive, and therefore, are not limiting.

One potential category is illustrated in 502, "materials". Items that might be considered under this category include types of substrates, the number and design of test structures, the composition of the highly reflective layer, the composition of alloying or dopant species (in both the reflective layers and the TCO layers), the concentration of the alloying or dopant species, the layer thicknesses, and the like. Those skilled in the art will realize that there may be tens or hundreds of possibilities in this category.

A second potential category is illustrated in 504, "deposition conditions". These conditions would be applicable for each of the multiple layers illustrated in FIG. 4. Items that might be considered under this category include possible use of an in-situ clean (e.g. an ion beam sputter cleaning system), pressure, power, gas composition, co-sputter deposition, nanolaminate deposition, and the like. Those skilled in the art will realize that there may be tens or hundreds of possibilities in this category.

A second potential category is illustrated in 506, "anneal". This category addresses post-deposition treatments that may impact the performance of the device. Items that might be considered under this category include temperature, time, atmosphere composition, ramp rate, 1-step versus multi-step processes and the like. Those skilled in the art will realize that there may be tens or hundreds of possibilities in this category.

Those skilled in the art will understand that the three categories listed in FIG. 5 represent a sub-set of the possible categories. Within each category, there will be multiple items, each of which needs to be evaluated with respect to its suitability for use in the manufacture of an optoelectronic device. Therefore, the total number of experiments easily reaches into the thousands. As discussed previously, the application of HPC methodology to the development of contact stacks for optoelectronic devices can decrease the time required to screen the possibilities, reduce the number of substrates required, and lower the costs of the development.

Typically, the layers used within the contact stack for optoelectronic devices are deposited using physical vapor deposition (PVD) techniques. One such technique is sputtering. HPC methodologies have been successfully adapted to sputter deposition.

Figure 6:
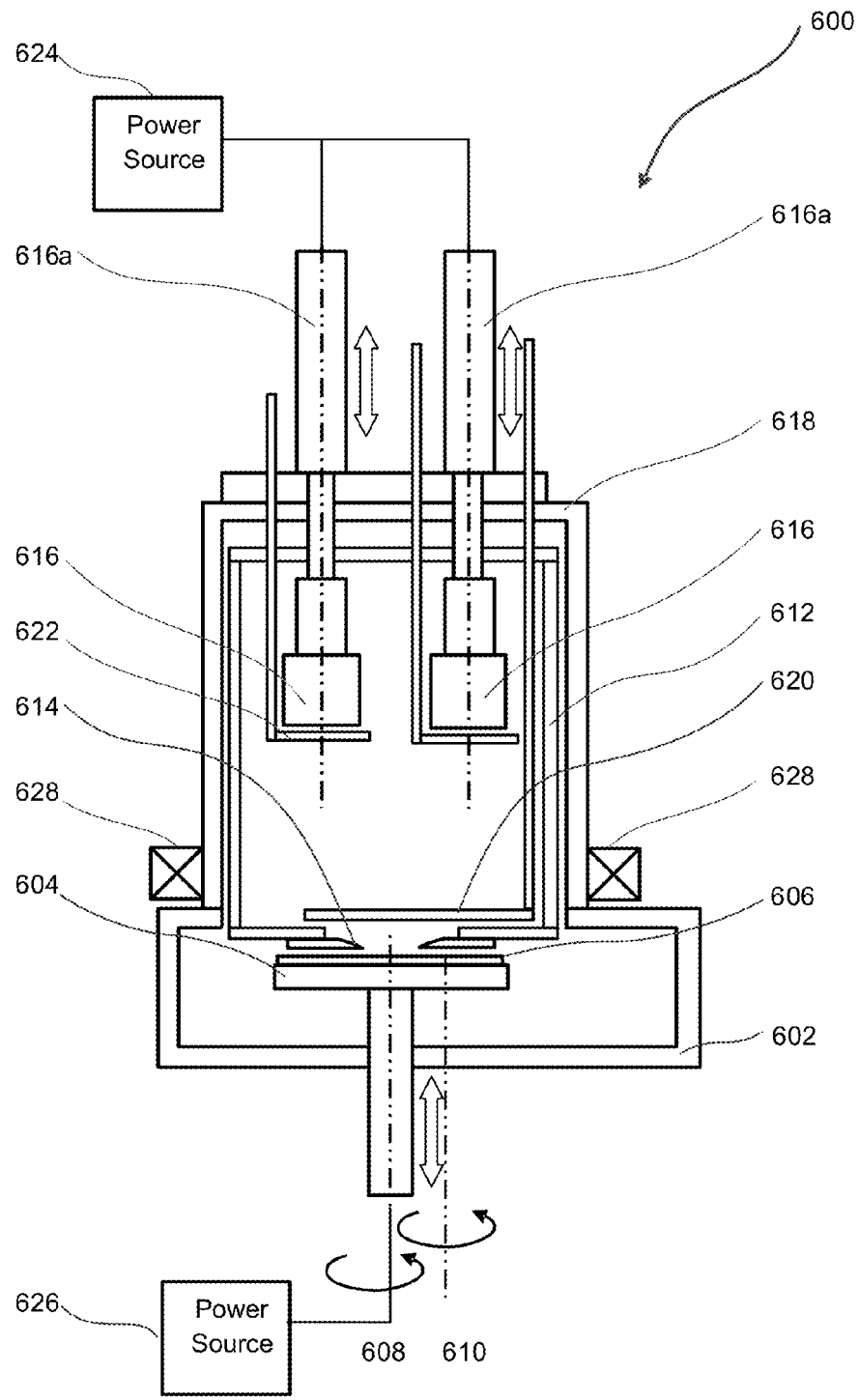
FIG. 6 illustrates a schematic diagram of a combinatorial PVD system according to some embodiments described herein.

FIG. 6 is a simplified schematic diagram illustrating a sputter chamber configured to perform combinatorial processing and full substrate processing in accordance with some embodiments of the invention. Processing chamber 600 includes a bottom chamber portion 602 disposed under top chamber portion 618. Within bottom portion 602, substrate support 604 is configured to hold a substrate 606 disposed thereon and can be any known substrate support, including but not limited to a vacuum chuck, electrostatic chuck or other known mechanisms. Substrate support 604 is capable of both rotating around its own central axis 608 (referred to as "rotation" axis), and rotating around an exterior axis 610 (referred to as "revolution" axis). Such dual rotary substrate support is central to combinatorial processing using site-isolated mechanisms. Other substrate supports, such as an XY table, can also be used for site-isolated deposition. In addition, substrate support 604 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 626 provides a bias power to substrate support 604 and substrate 606, and produces a negative bias voltage on substrate 606. In some embodiments power source 626 provides a radio frequency (RF) power sufficient to take advantage of the high metal ionization to improve step coverage of vias and trenches of patterned wafers. In another embodiment, the RF power supplied by power source 626 is pulsed and synchronized with the pulsed power from power source 624. Further details of the power sources and their operation may be found in U.S. patent application Ser. No. 13/281,316 entitled "High Metal Ionization Sputter Gun" filed on Oct. 25, 2011 and is herein incorporated by reference for all purposes.

Substrate 606 may be a conventional round 200 mm, 300 mm, or any other larger or smaller substrate/wafer size. In some embodiments, substrate 606 may be a square, rectangular, or other shaped substrate. One skilled in the art will appreciate that substrate 606 may be a blanket substrate, a coupon (e.g., partial wafer), or even a patterned substrate having predefined regions. In another embodiment, substrate 606 may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion 618 of chamber 600 in FIG. 6 includes process kit shield 612, which defines a confinement region over a radial portion of substrate 606. Process kit shield 612 is a sleeve having a base (optionally integrated with the shield) and an optional top within chamber 600 that may be used to confine a plasma generated therein. The generated plasma will dislodge atoms from a target and the sputtered atoms will deposit on an exposed surface of substrate 606 to combinatorial process regions of the substrate in some embodiments. In another embodiment, full wafer processing can be achieved by optimizing gun tilt angle and target-to-substrate spacing, and by using multiple process guns 616. Process kit shield 612 is capable of being moved in and out of chamber 600, i.e., the process kit shield is a replaceable insert. In another embodiment, process kit shield 612 remains in the chamber for both the full substrate and combinatorial processing. Process kit shield 612 includes an optional top portion, sidewalls and a base. In some embodiments, process kit shield 612 is configured in a cylindrical shape, however, the process kit shield may be any suitable shape and is not limited to a cylindrical shape.

The base of process kit shield 612 includes an aperture 614 through which a surface of substrate 606 is exposed for deposition or some other suitable semiconductor processing operations. Aperture shutter 620 which is moveably disposed over the base of process kit shield 612. Aperture shutter 620 may slide across a bottom surface of the base of process kit shield 612 in order to cover or expose aperture 614 in some embodiments. In another embodiment, aperture shutter 620 is controlled through an arm extension which moves the aperture shutter to expose or cover aperture 614. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 614 may be a larger opening and plate 620 may extend with that opening to either completely cover the aperture or place one or more fixed apertures within that opening for processing the defined regions. The dual rotary substrate support 604 is central to the site-isolated mechanism, and allows any location of the substrate or wafer to be placed under the aperture 614. Hence, the site-isolated deposition is possible at any location on the wafer/substrate.

A gun shutter, 622 may be included. Gun shutter 622 functions to seal off a deposition gun when the deposition gun may not be used for the processing in some embodiments. For example, two process guns 616 are illustrated in FIG. 6. Process guns 616 are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter 622 can be transitioned to isolate the lifted process guns from the processing area defined within process kit shield 612. In this manner, the process guns are isolated from certain processes when desired. It should be appreciated that slide cover plate 622 may be integrated with the top of the process kit shield 612 to cover the opening as the process gun is lifted or individual cover plate 622 can be used for each target. In some embodiments, process guns 616 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 618 of chamber 600 of FIG. 6 includes sidewalls and a top plate which house process kit shield 612. Arm extensions 616a, which are fixed to process guns 616 may be attached to a suitable drive, e.g., lead screw, worm gear, etc., configured to vertically move process guns 616 toward or away from a top plate of top chamber portion 618. Arm extensions 616a may be pivotally affixed to process guns 616 to enable the process guns to tilt relative to a vertical axis. In some embodiments, process guns 616 tilt toward aperture 614 when performing combinatorial processing and tilt toward a periphery of the substrate being processed when performing full substrate processing. It should be appreciated that process guns 616 may tilt away from aperture 614 when performing combinatorial processing in another embodiment. In yet another embodiment, arm extensions 616a are attached to a bellows that allows for the vertical movement and tilting of process guns 616. Arm extensions 616a enable movement with four degrees of freedom in some embodiments. Where process kit shield 612 is utilized, the aperture openings are configured to accommodate the tilting of the process guns. The amount of tilting of the process guns may be dependent on the process being performed in some embodiments. Power source 624 provides power for sputter guns 616 whereas power source 626 provides RF bias power to an electrostatic chuck to bias the substrate when necessary. It should be appreciated that power source 624 may output a direct current (DC) power supply or a radio frequency (RF) power supply.

Chamber 600 includes auxiliary magnet 628 disposed around an external periphery of the chamber. The auxiliary magnet 628 is located in a region defined between the bottom surface of sputter guns 616 and a top surface of substrate 606. Magnet 628 may be either a permanent magnet or an electromagnet. It should be appreciated that magnet 628 is utilized to provide more uniform bombardment of argon ions and electrons to the substrate in some embodiments.

Figure 7:
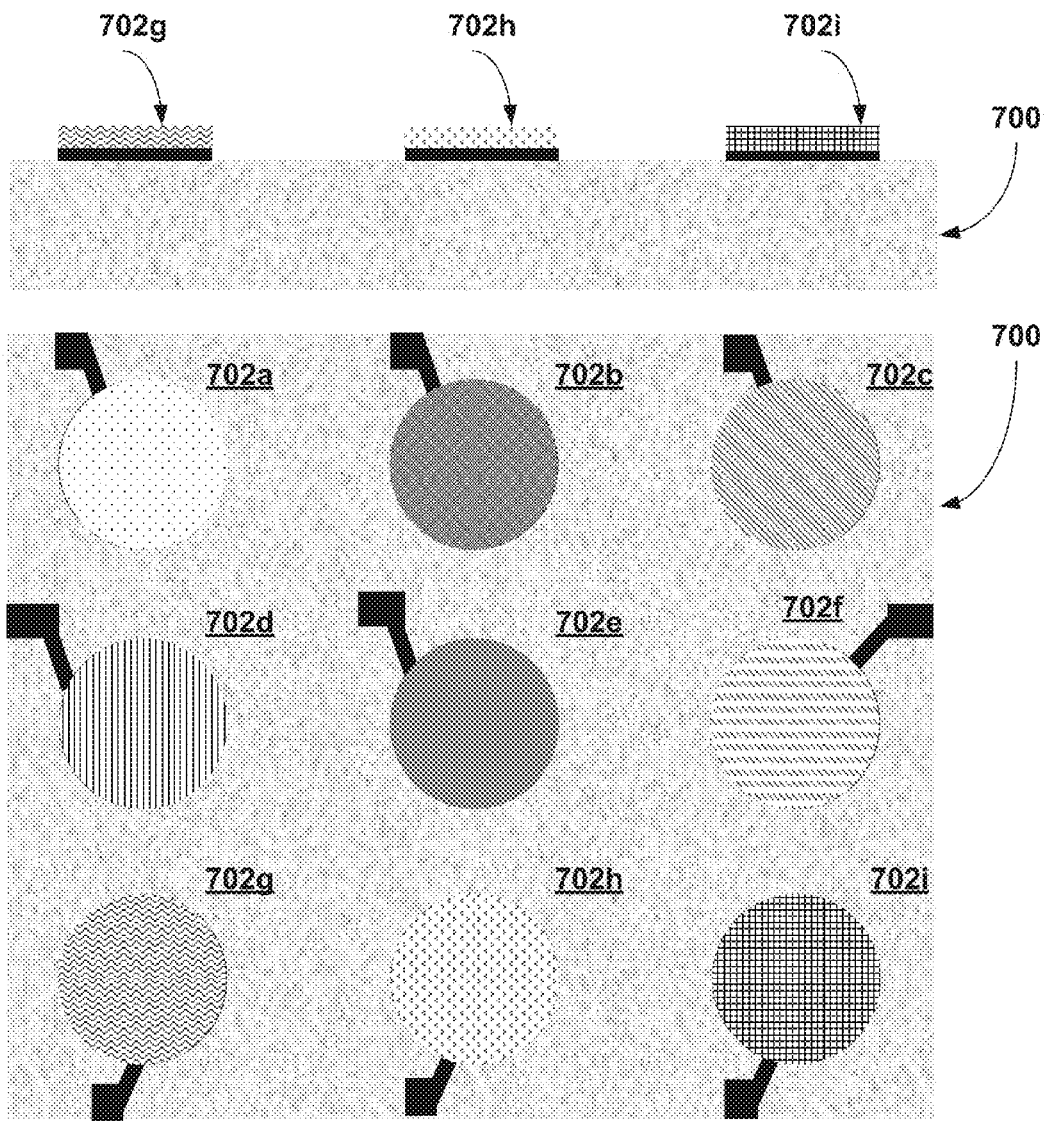
FIG. 7 illustrates a schematic diagram of a substrate that has been processed in a combinatorial manner.

FIG. 7 illustrates a schematic diagram of a substrate that has been processed in a combinatorial manner. Although the substrate in FIG. 7 is illustrated as being a generally square shape, those skilled in the art will understand that the substrate may be any useful shape such as round, rectangular, etc. FIG. 7 illustrates a substrate, 700, with nine site isolated regions, 702a-702i, illustrated thereon. The lower portion of FIG. 7 illustrates a top down view while the upper portion of FIG. 7 illustrates a cross-sectional view taken through the three site isolated regions, 702g-702i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 8:
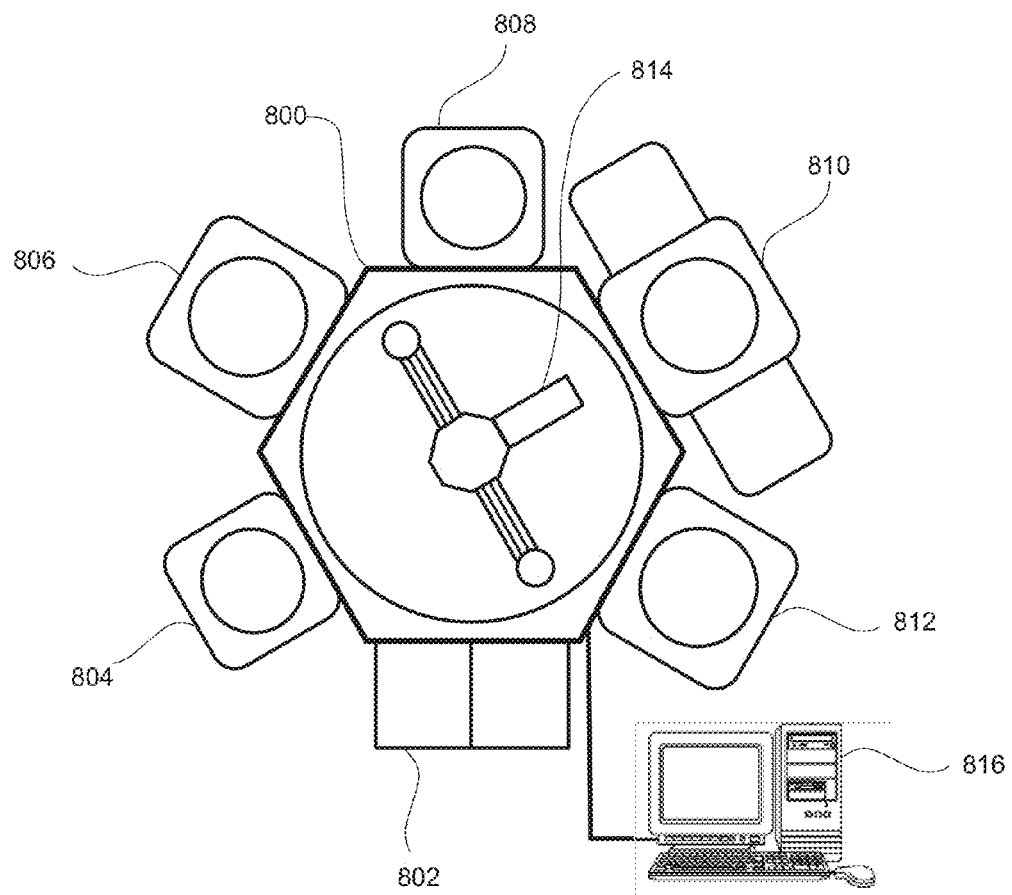
FIG. 8 illustrates a schematic diagram of a cluster system according to some embodiments described herein.

FIG. 8 is a simplified schematic diagram illustrating an integrated high productivity combinatorial (HPC) system in accordance with some embodiments of the invention. HPC system includes a frame 800 supporting a plurality of processing modules. It should be appreciated that frame 800 may be a unitary frame in accordance with some embodiments. In some embodiments, the environment within frame 800 is controlled. Load lock/factory interface 802 provides access into the plurality of modules of the HPC system. Robot 814 provides for the movement of substrates (and masks) between the modules and for the movement into and out of the load lock 802. Modules 804-812 may be any set of modules and preferably include one or more combinatorial modules. For example, module 804 may be an orientation/degassing module, module 806 may be a clean module, either plasma or non-plasma based, modules 808 and/or 810 may be combinatorial/conventional dual purpose modules. Module 812 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 816, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Figure 9:
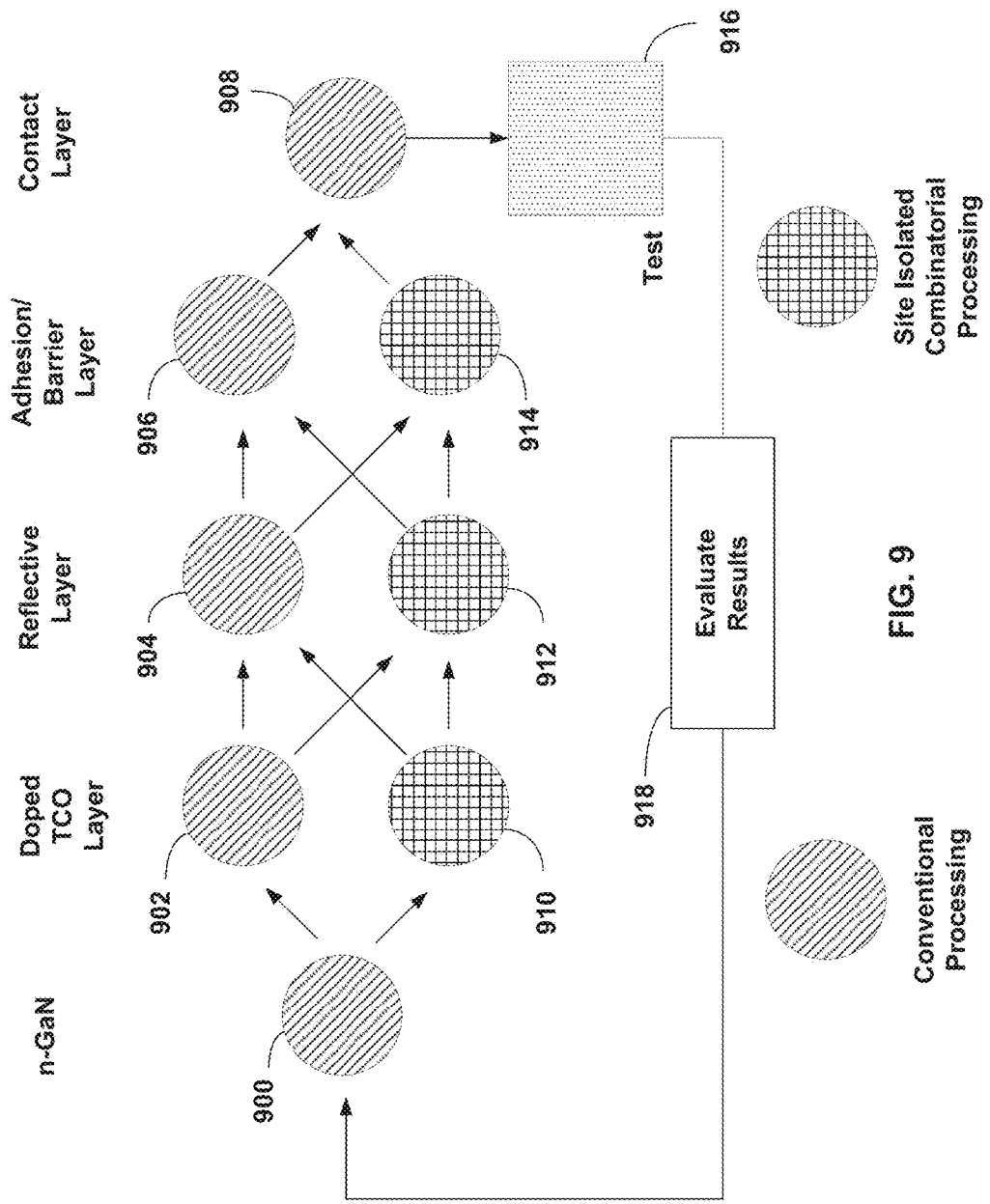
FIG. 9 illustrates a flow diagram for forming a GaN LED stack according to some embodiments described herein.

FIG. 9 illustrates a diagram of potential process sequences for forming a simple n-GaN contact stack according to some embodiments described herein. Although contact stacks for n-GaN will be used as an illustration, the same principles apply to p-GaN and to contacts to other optoelectronic materials as discussed previously. For GaN LED devices, several of the layers in the contact stack provide opportunities to apply combinatorial techniques to the development and investigation of the materials and treatments for the layers. For n-GaN contact stacks, candidate layers include the adhesion/barrier layer, the reflective layer, and the TCO layer. Remembering that this discussion is using a flip-chip configuration as an example, the sequence of the depositions will be in the direction "top down" when referring to FIG. 4 (e.g. the sequence is n-GaN-TCO-reflective layer-adhesion/barrier layer-contact layer).

A first layer that may be investigated using HPC techniques includes the TCO layer (when used in the stack). Examples of suitable TCO layer materials comprise doped zinc oxide, indium tin oxide and indium zinc oxide, and the like. The material composition and/or the thickness of the TCO layer may be varied in a combinatorial manner. Typically, PVD is the preferred method of deposition for the TCO layer. The PVD processes are typically conducted in a vacuum environment. The deposition of the TCO layer by PVD may be investigated using HPC techniques by varying process parameters such as power, pressure, target to substrate distance, atomic ratio, and the like. These are meant to be illustrative parameters and those skilled in the art will be able to apply HPC techniques to any of the commonly used process parameters.

A second layer that may be investigated using HPC techniques includes the reflective layer. The material composition and/or the thickness of the reflective layer may be varied in a combinatorial manner. The reflective layer may be formed using a variety of techniques such as PVD. The PVD processes are typically conducted in a vacuum environment. Typically, PVD is the preferred method of deposition for the reflective layer. The deposition of the reflective layer by PVD may be investigated using HPC techniques by varying process parameters such as power, pressure, target to substrate distance, atomic ratio, and the like. These are meant to be illustrative parameters and those skilled in the art will be able to apply HPC techniques to any of the commonly used process parameters.

A third layer that may be investigated using HPC techniques includes the adhesion/barrier layer. Examples of suitable adhesion/barrier layers comprise TiW, TiN, TaN, WN, and the like. TiW is the material most often used as the adhesion/barrier layer in GaN LED devices. The material composition and/or the thickness of the adhesion/barrier layer may be varied in a combinatorial manner. The adhesion/barrier layer may be deposited using PVD. The PVD processes are typically conducted in a vacuum environment. The deposition of the adhesion/barrier layer by PVD may be investigated using HPC techniques by varying process parameters such as power, pressure, target to substrate distance, atomic ratio, sputter gas composition, and the like. These are meant to be illustrative parameters and those skilled in the art will be able to apply HPC techniques to any of the commonly used PVD process parameters.

Returning to FIG. 9, through the use of a combination of conventional and combinatorial processing systems (i.e. systems capable of processing multiple isolated regions on a single substrate) a number of trajectories through the various systems illustrated in the flow diagram of FIG. 9 can be envisioned. In FIG. 9, the n-GaN layer may be deposited in a conventional processing manner, 900, since the n-GaN layer is well characterized for LED contact stacks. As discussed previously, the TCO layer may be deposited in a conventional processing manner, 902, or in a site isolated combinatorial processing manner, 910. As discussed previously, the reflective layer may be deposited in a conventional processing manner, 904, or in a site isolated combinatorial processing manner, 912. As discussed previously, the adhesion/barrier layer may be deposited in a conventional processing manner, 906, or in a site isolated combinatorial processing manner, 914. The contact layer may be deposited in a conventional processing manner, 908, since the contact layer is well characterized for LED devices. After the deposition of the various layers and subsequent processing, the various devices represented by each of the site isolated regions may be tested in step 916, and the results evaluated in step, 918. As discussed previously, the results will form the basis for additional cycles of investigation through HPC techniques to identify materials and process conditions that increase the efficiency of the LED device.

Using the simple diagram in FIG. 9, there are eight possible trajectories through the process sequence. These eight trajectories encompass all of the possible combinations of conventional and combinatorial processing illustrated. Those skilled in the art will understand that HPC techniques may be applied to other processes not illustrated such as anneal treatments, cleaning, etching, surface treatments, surface functionalization, etc. As more variable process steps are included, the total number of required experiments increases dramatically. This illustrates the benefits of using HPC techniques to limit the number of substrates to a manageable number and minimize the cost of the development program. The eight possible trajectories through the process sequence are listed in Table 1 below using the process step identifiers from FIG. 9:

TABLE 1

| n-GaN Layer | TCO Layer | Reflective Layer | Adhesion/Barrier Layer | Contact Layer |
|---|---|---|---|---|
| 900 | 902 | 904 | 906 | 908 |
| 900 | 902 | 904 | 914 | 908 |
| 900 | 902 | 912 | 906 | 908 |
| 900 | 902 | 912 | 914 | 908 |
| 900 | 910 | 904 | 906 | 908 |
| 900 | 910 | 904 | 914 | 908 |
| 900 | 910 | 912 | 906 | 908 |
| 900 | 910 | 912 | 914 | 908 |

Therefore, methods of using HPC methodologies applied to the development of contact stacks to optoelectronic devices have been described. The methods make use of the ability to vary materials, process parameters, process sequences, and post deposition treatment processes across multiple site-isolated regions on a substrate in a combinatorial manner using both conventional processing modules as well as combinatorial processing modules. Although the manufacture of contact stacks for GaN LED devices was used as an example, the methods are generally applicable to a wide range of Group III-V optoelectronic materials and devices.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming an optoelectronic device in a combinatorial manner, the method comprising:
   providing a substrate, wherein the substrate comprises a plurality of site-isolated regions defined thereon;
   depositing a first layer on each of the site-isolated regions, wherein the first layer is operable as an optoelectronic material;
   depositing a second layer above the first layer on each of the site-isolated regions, wherein the second layer is operable as a reflective layer;
   depositing a third layer above the second layer on each of the site-isolated regions, wherein the third layer is operable as an adhesion/barrier layer;
   wherein at least one of the second layer or the third layer is varied in a combinatorial manner between each of the site-isolated regions.

2. The method of claim 1 wherein the first layer is a doped Group III-V semiconductor material.

3. The method of claim 2 wherein the first layer is one of AlN, GaN, InN, AlAs, GaAs, InAs, AlP, GaP, InP, AlSb, GaSb, or InSb.

4. The method of claim 3 wherein the first layer comprises n-type GaN.

5. The method of claim 3 wherein the first layer comprises p-type GaN.

6. The method of claim 1 further comprising depositing a fourth layer between the first layer and the second layer on each of the site-isolated regions, wherein the fourth layer is operable as a transparent conductive oxide layer.

7. The method of claim 6 wherein the fourth layer is varied in a combinatorial manner between each of the site-isolated regions.

8. The method of claim 7 wherein the fourth layer comprises one of doped zinc oxide, indium tin oxide and indium zinc oxide.

9. The method of claim 8 wherein the fourth layer further comprises a dopant.

10. The method of claim 9 wherein the second layer comprises ZnO and the dopant is at least one of Al, Ga, Y, Nb, or Sc.

11. The method of claim 1 wherein the second layer comprises one of Ag or Al.

12. The method of claim 11 wherein the second layer comprises a dopant.

13. The method of claim 12 wherein the second layer comprises Ag and the dopant is at least one of Y, Yb, Nd, Tb, Eu, Gd, or Sm.

14. The method of claim 12 wherein the second layer comprises Ag and the dopant is at least one of Pt, Pd, Be, Rh, Co, Te, Ni, Au, Ir, Os, or Se.

15. The method of claim 1 wherein the third layer comprises at least one of TiW, TiN, TaN, WN, Ti, Ta, and W.

16. The method of claim 1 wherein:
   the first layer comprises n-type GaN;
   the second layer comprises Ag, and wherein second layer further comprises at least one of Y, Yb, Nd, Tb, Eu, Gd, or Sm.

17. The method of claim 1 wherein:
   the first layer comprises n-type GaN;
   the second layer comprises Ag, and wherein the second layer further comprises at least one of Y, Yb, Nd, Tb, Eu, Gd, or Sm; and
   the fourth layer comprises ZnO, and wherein the fourth layer further comprises at least one of Al, Ga, Y, Nb, or Sc.

18. The method of claim 1 wherein:
   the first layer comprises p-type GaN;
   the second layer comprises Ag, and wherein second layer further comprises at least one of Pt, Pd, Be, Rh, Co, Te, Ni, Au, Ir, Os, or Se.

19. The method of claim 1 wherein:
   the first layer comprises p-type GaN;
   the second layer comprises Ag, and wherein second layer further comprises at least one of Pt, Pd, Be, Rh, Co, Te, Ni, Au, Ir, Os, or Se; and
   the fourth layer comprises ZnO, and wherein the fourth layer further comprises at least one of Al, Ga, Y, Nb, or Sc.

* * * * *